United States Patent
Ozawa (10) Patent No.: US 11,022,644 B2
(45) Date of Patent: Jun. 1, 2021

(54) INSPECTION APPARATUS AND INSPECTION METHOD

(71) Applicant: TOKYO ELECTRON LIMITED, Tokyo (JP)

(72) Inventor: Junya Ozawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/707,385

(22) Filed: Dec. 9, 2019

(65) Prior Publication Data
US 2020/0182929 A1  Jun. 11, 2020

(30) Foreign Application Priority Data
Dec. 11, 2018 (JP) .............................. JP2018-231571

(51) Int. Cl.
*G01R 31/28* (2006.01)
*G01R 1/073* (2006.01)

(52) U.S. Cl.
CPC ..... *G01R 31/2887* (2013.01); *G01R 1/07342* (2013.01); *G01R 31/2891* (2013.01); *G01R 31/2893* (2013.01)

(58) Field of Classification Search
CPC .............. G01R 1/0408; G01R 31/2601; G01R 31/2891
See application file for complete search history.

(56) References Cited

U.S. PATENT DOCUMENTS

| 6,697,145 B1* | 2/2004 | Aoyama | G03F 7/70991 355/53 |
|---|---|---|---|
| 2004/0227925 A1* | 11/2004 | Sato | G03F 9/7011 355/72 |

FOREIGN PATENT DOCUMENTS

| JP | 2002-270481 A | 9/2002 |
|---|---|---|
| JP | 2014-29917 A | 2/2014 |
| JP | 2016-58506 A | 4/2016 |

\* cited by examiner

*Primary Examiner* — Tung X Nguyen
(74) *Attorney, Agent, or Firm* — Nath, Goldberg & Meyer; Jerald L. Meyer (57) ABSTRACT

There is provided an inspection apparatus provided with a plurality of inspection chambers for inspecting an electrical characteristic of a semiconductor device formed on a substrate, the inspection apparatus includes: a substrate chuck part configured to attractively hold the substrate during an inspection; a measurement part configured to measure an attractive force of the substrate chuck part in a state in which the substrate is placed on the substrate chuck part; and a controller configured to perform a first determination based on a first condition and a measurement result of the measurement part and a second determination based on a second condition different from the first condition and the measurement result of the measurement part, and configured to select one of a plurality of preset operations based on a result of the first determination and a result of the second determination and execute a process corresponding to the selected operation.

5 Claims, 5 Drawing Sheets

INSPECTION APPARATUS AND INSPECTION METHOD

CROSS-REFERENCE TO RELATED APPLICATION

This application is based upon and claims the benefit of priority from Japanese Patent Application No. 2018-231571, filed on Dec. 11, 2018, the entire contents of which are incorporated herein by reference.

TECHNICAL FIELD

Some embodiments of the present disclosure relate to an inspection apparatus and an inspection method.

BACKGROUND

As an inspection apparatus for inspecting a wafer substrate, for example, a probe device for inspecting electrical characteristics of a plurality of semiconductor devices formed on the substrate has been known. Patent Document 1 discloses a technique related to a method of bringing a substrate into contact with a probe card provided in the probe device. In the method disclosed in Patent Document 1, a wafer (substrate) is first placed on a chuck member via a wafer plate. Thereafter, the wafer is transferred to a position facing the probe card. The transferred wafer is moved together Ti the wafer plate towards the probe card using a lifting device. After the movement, a plurality of electrodes of the semiconductor devices provided in the wafer are brought into contact with a plurality of probes provided in the probe card, respectively. After this contact, the water is further overdriven towards the probe card. Thereafter, a space between the probe card and the wafer plate is depressurized to maintain the contact state between the electrodes of the semiconductor devices and the probes of the probe card, and the chuck member is separated from the wafer plate.

PRIOR ART DOCUMENT

Patent Documents

Patent Document 1: Japanese Laid-Open Patent Publication No. 2014-29917

SUMMARY

According to an embodiment of the present disclosure, there is provided an inspection apparatus provided with a plurality of inspection chambers for inspecting an electrical characteristic of a semiconductor device formed on a substrate, the inspection apparatus includes: a substrate chuck part configured to attractively hold the substrate during an inspection; a measurement part configured to measure an attractive force of the substrate chuck part in a state in which the substrate is placed on the substrate chuck part; and a controller configured to perform a first determination based on a first condition and a measurement result of the measurement part and a second determination based on a second condition different from the first condition and the measurement result of the measurement part, and configured to select one of a plurality of preset operations based on a result of the first determination and a result of the second determination and execute a process corresponding to the selected operation.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First, various embodiments of the present disclosure will be listed and described. In an embodiment, an inspection apparatus is provided. The inspection apparatus includes a plurality of inspection chambers for inspecting electrical characteristics of semiconductor devices formed on a substrate. The inspection apparatus includes a substrate chuck part, a measurement part, and a controller. The substrate chuck part attractively holds the substrate during inspection. The measurement part measures an attractive force of the substrate chuck part in a state in which the substrate is placed on the substrate chuck part. The controller performs a first determination based on a first condition and the measurement result of the measurement part, and a second determination based on a second condition different from the first condition and the measurement result of the measurement part. The controller selects one of a plurality of preset operations based on the result of the first determination and the result of the second determination. The controller executes a process corresponding to the selected operation. As described above, the attraction state of the substrate is not determined only by the first determination based on the first condition; the attraction state of the substrate is determined after performing the second determination based on the second condition different from the first condition. Accordingly, the determination of the attraction state of the substrate is performed more precisely, thus more effectively coping with a problem that the attraction of the substrate to the substrate chuck part is poor.

In an embodiment, when it is determined that the first condition is not satisfied in the first determination and that the second condition is satisfied in the second determination, the controller controls a loader to collect the substrate. The loader performs the placement of the substrate on the substrate chuck part and the collection of the substrate from the substrate chuck part. Accordingly, it is possible to improve the collection efficiency of the substrate.

In the embodiment, the controller measures a positional deviation between a position of the substrate and a reference position of the substrate before the collection of the substrate, and adjusts a position of the substrate chuck part by controlling a movement part to correct the positional deviation when the positional deviation falls within a reference range. Accordingly, when a positional deviation occurs in the position of the substrate, it is possible to suitably correct the positional deviation of the substrate before the collection of the substrate.

In the embodiment, the controller controls the movement part to suppress a movement speed of the movement part when detecting the position of the substrate. Accordingly, it is possible to prevent the positional deviation of the substrate when detecting the position of the substrate.

In an embodiment, an inspection apparatus is provided. The inspection method inspects electrical characteristics of semiconductor devices formed on a substrate using an inspection apparatus including a plurality of inspection chambers. The inspection apparatus includes a substrate chuck part and a measurement part. The substrate chuck part attractively holds the substrate during inspection. The measurement part measures an attractive force of the substrate chuck part in the state in which the substrate is placed on the substrate chuck. The inspection method performs a first determination based on a first condition and the measurement result of the measurement part, and a second determination based on a second condition different from the first condition and the measurement result of the measurement part. The inspection method selects one of a plurality of preset operations based on the result of the first determination and the result of the second determination, and executes a process corresponding to the selected operation. As described above, the attraction state of the substrate is not determined only by the first determination based on the first condition; the attraction state of the substrate is determined after performing the second determination based on the second condition different from the first condition. Accordingly, since the determination of the attraction state of the substrate is performed more precisely, it is possible to more effectively cope with a problem that the attraction of the substrate to the substrate chuck part is poor.

Figure 1:
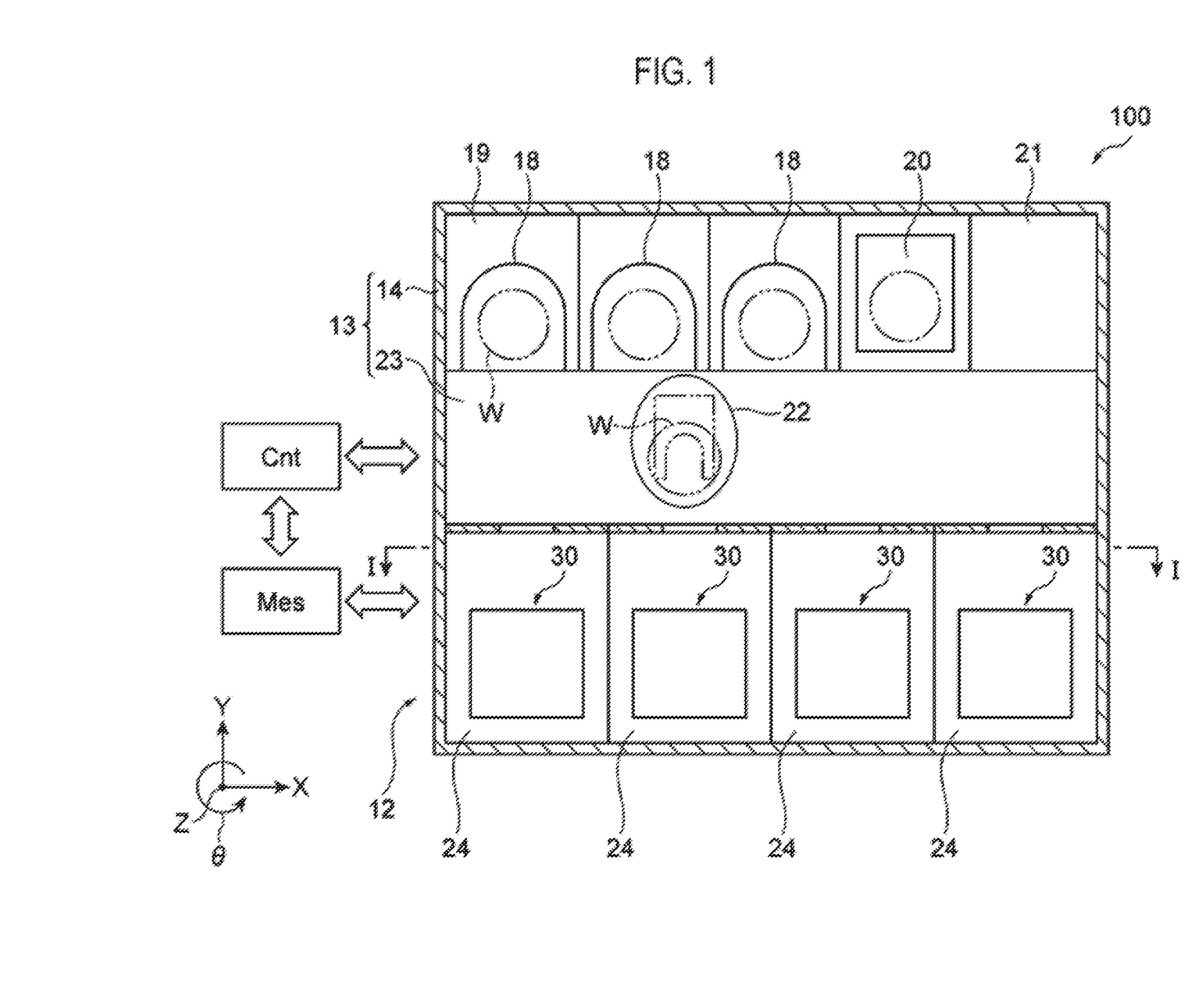
FIG. 1 is a view schematically illustrating an exemplary configuration of an inspection apparatus according to an embodiment.
Figure 2:
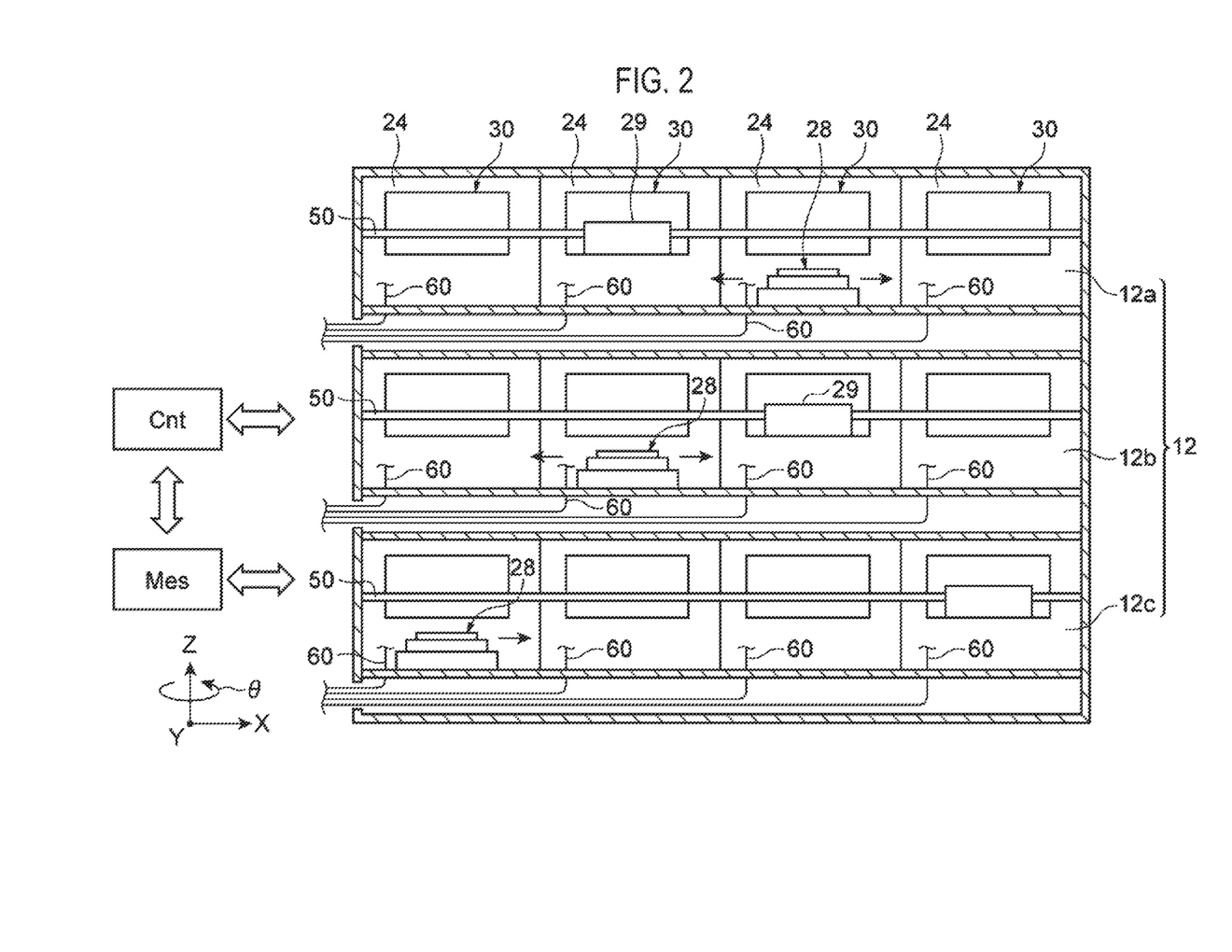
FIG. 2 is a view schematically illustrating an exemplary sectional configuration of the inspection apparatus illustrated in FIG. 1.
Figure 3:
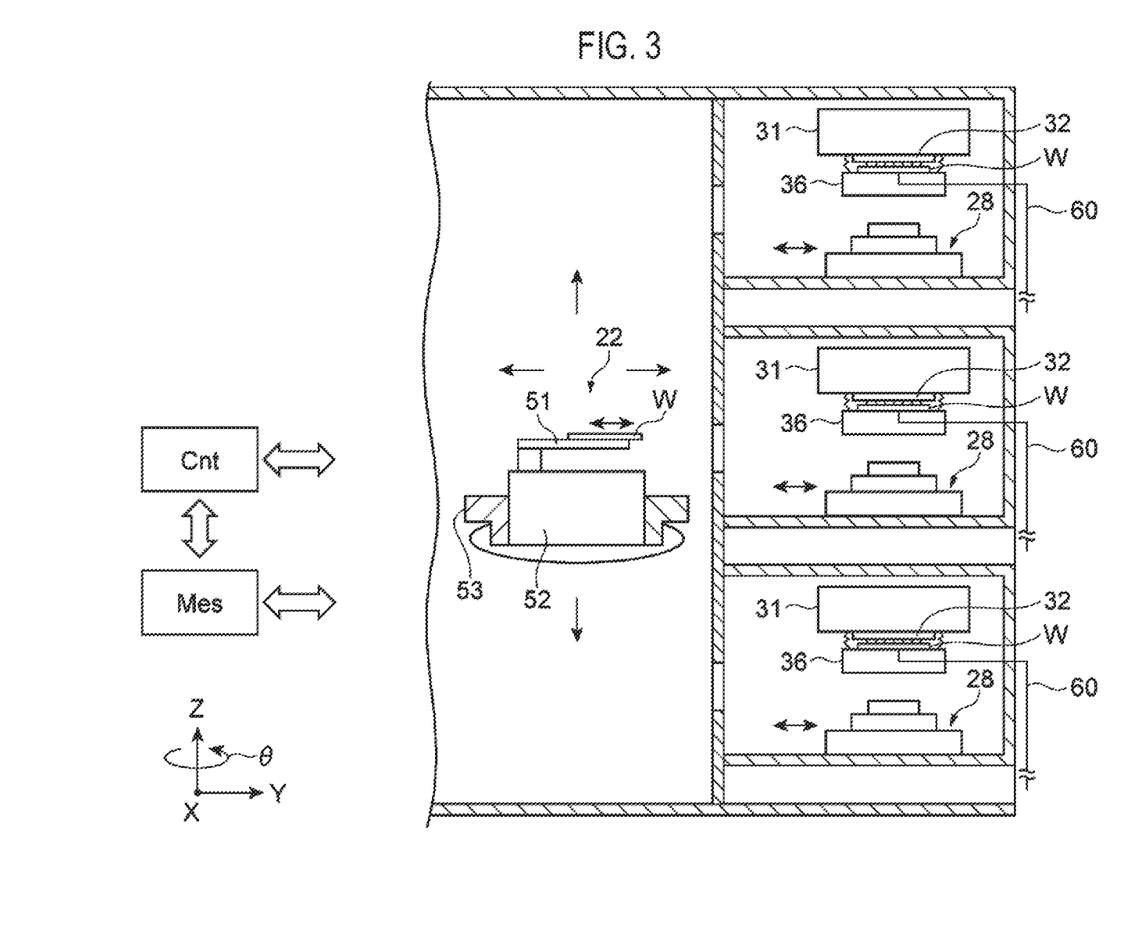
FIG. 3 is a view schematically illustrating an exemplary sectional configuration of the inspection apparatus illustrated in FIG. 1.
Figure 4:
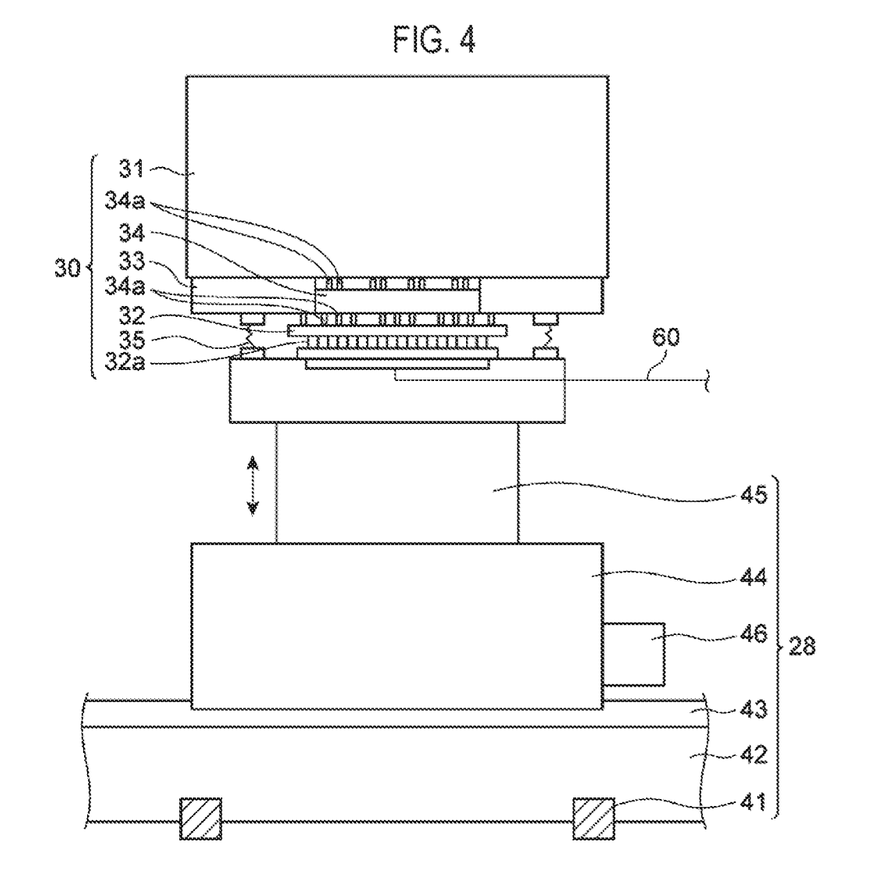
FIG. 4 is a view illustrating an exemplary configuration of an inspection unit illustrated in FIG. 1 and an exemplary configuration of a movement part illustrated in FIG. 2 in more detail.

Hereinafter, various embodiments will be described in detail with reference to the accompanying drawings. In each drawing, the same or corresponding components will be denoted by the same reference numerals. With reference to FIG. 1, an exemplary configuration of an inspection apparatus 100 according to an embodiment will be described. With reference to FIG. 2, an exemplary configuration of a cross section (the cross section taken along line I-I in FIG. 1) of the inspection apparatus 100 illustrated in FIG. 1 will be described. With reference to FIG. 3, an exemplary configuration of another cross section (a Y-Z plane) of the inspection apparatus 100 shown in FIG. 1 will be described. With reference to FIG. 4, the exemplary configuration of the inspection apparatus 100 illustrated in FIG. 1 and an exemplary configuration of a movement part 28 illustrated in FIG. 2 will be described in more detail.

The inspection apparatus 100 according to the embodiment is an apparatus that inspects electrical characteristics of a plurality of semiconductor devices formed on a substrate W (wafer).

The inspection apparatus 100 includes an inspection part 12, a loader 13, a controller Cnt, and a measurement part Mes. The inspection part 12 inspects the electrical characteristics of the semiconductor devices formed on the substrate W. The loader 13 loads and unloads the substrate W into and from the inspection part 12. More specifically, for example, when inspecting the electrical characteristics of the semiconductor devices, the loader 13 mounts the substrate W on a substrate chuck part 36 and collects the substrate W from the substrate chuck part 36. As illustrated in FIG. 1, the inspection apparatus 100 is configured by connecting the inspection part 12 and the loader 13.

The controller Cnt controls each part of the inspection apparatus 100. The measurement part Mes measures physical parameter values of each part of the inspection apparatus 100 and sends the same to the controller Cnt.

The inspection part 12 includes an upper inspection space 12a, a middle inspection space 12b, and a lower inspection space 12c. The upper inspection space 12a, the middle inspection space 12b, and the lower inspection space 12c are sequentially arranged in the Z direction e the vertical direction). The middle inspection space 12b is provided on the lower inspection space 12c, and the upper inspection space 12a is provided on the middle inspection space 12b.

Each of the upper inspection space 12a, the middle inspection space 12b, and the lower inspection space 12c includes four inspection chambers 24. In each of the upper inspection space 12a, the middle inspection space 12b, and the lower inspection space 12c, the four inspection chambers 24 are arranged in series in the X direction.

Each of the upper inspection space 12a, the middle inspection space 12b, and the lower inspection space 12c includes the movement part 28. The movement part 28 is configured to operate under the control of the controller Cnt. The movement part 28 is movable in the X-Y direction the horizontal direction) in order to move the substrate W that is transferred from the loader 13 below an inspection unit 30 to be described later.

Each of the upper inspection space 12a, the middle inspection space 12b, and the lower inspection space 12c includes a guide rail 41. The guide rail 41 extends in the X direction across the four inspection chambers 24 in each of the upper inspection space 12a, the middle inspection space I 2b, and the lower inspection space 12c.

The inspection part 12 includes three upper cameras 29. The upper camera 29 detects a position of the substrate \V placed on the substrate chuck part 36.

The upper camera 29 is configured to operate under the control of the controller Cnt. The three upper cameras 29 are disposed in the upper inspection space 12a, the middle inspection space 12b, and the lower inspection space 12c, respectively.

In each of the upper inspection space 12a, the middle inspection space 12b, and the lower inspection space 12c, the upper camera 29 is movable along a guide rail 50 in a direction (the X direction) in which the four inspection chambers 24 are arranged in series, and may be appropriately disposed in each of the four inspection chambers 24. In each of the upper inspection space 12a, the middle inspection space 12b, and the lower inspection space 12c, the upper camera 29 is movable in the X direction closer to the loader 13 than the inspection unit 30. 100291 Each of the inspection chambers 24 includes an inspection unit 30. The inspection unit 30 is configured to operate under the control of the controller Cnt. The inspection unit 30 may be a prober.

The loader 13 includes a loading/unloading part 14 and a transfer chamber 23. The loading/unloading part 14 includes a loading port 19, an unloading table 20, and an aligning part 21. The loading port 19, the unloading table 20, and the aligning part 21 are arranged in series in the X direction.

The loading port 19 includes a transfer container 18. The transfer container 18 may be a container called a front opening unified pod (FOUP), and is capable of accommodating a plurality of substrates W.

The aligning part 21 performs the alignment on the substrates W before transferring the substrates W to the inspection part 12.

The transfer chamber 23 is provided between the inspection part 12 and the loading/unloading part 14. The transfer chamber 23 includes a transfer mechanism 22. The transfer mechanism 22 transfers the substrate W. The transfer mechanism 22 is capable of traveling inside the transfer chamber 23. The transfer mechanism 22 is configured to operate under the control of the controller Cnt.

The transfer mechanism 22 includes a transfer arm 51, a rotation drive part 52, and a base part 53. The transfer arm 51 is a loader arm that supports the substrate W. The rotation drive part 52 rotates the transfer arm 51. The base part 53 supports the rotation drive part 52.

The transfer mechanism 22 is movable in the Z direction and the X-Y direction. The transfer mechanism 22 receives an uninspected substrate W from the transfer container 18 by backward and forward movements and the rotation of the transfer arm 51 in a θ direction, and delivers the substrate W to each inspection chamber 24 in each of the upper inspection space 12a, the middle inspection space 12b, and the lower inspection space 12c. The transfer mechanism 22 is capable of receiving the inspected substrate W and returning the same to the transfer container 18.

The inspection unit 30 includes a tester 31, a probe card 32, a plurality of probes 32a, a support plate 33, a contact block 34, a plurality of pogo pins 34a, and a bellows 35. The tester 31 is capable of sending an inspection signal to each semiconductor device formed on the substrate W. The probe card 32 has the plurality of probes 32a. Each of the plurality of probes 32a comes into contact with an electrode of each of the plurality of semiconductor devices formed on the substrate W.

The support plate 33 supports the probe card 32. The support plate 33 is provided below the tester 31. The contact block 34 connects the tester 31 and the probe card 32.

The plurality of pogo pins 34a electrically connect the probe card 32 and the tester 31. The plurality of pogo pins 34a are provided on upper and lower surfaces of the contact block 34. The bellows 35 is provided to be suspended downwards from the support plate 33 while surrounding the probe card 32.

The bellows 35 forms a hermetically-sealed space including the probe card 32 and the substrate W in the state in which the substrate W placed on the substrate chuck part 36 is in contact with the plurality of probes 32a of the probe card 32. By evacuating the sealed space formed by the bellows 35 via a vacuum line 60, the substrate chuck part 36 is capable of being attracted to the support plate 33. The vacuum line 60 is connected to a vacuum source such as a pump.

The probe card 32 is also attracted to the support plate 33 by evacuating the hermetically-sealed space formed by the bellows 35 in the same manner. The substrate chuck part 36 is capable of supporting the substrate W placed on the substrate chuck part 36 by the vacuum attraction.

The movement part 28 includes the guide rail 41, an X block 42, a guide rail 43, a Y block 44, a Z block 45, and a lower camera 46. The X block 42 is movable on the guide rail 41 in the X direction. The guide rail 43 is disposed on the X block 42 and extends in the Y direction. The Y block 44 is movable on the guide rail 43 in the Y direction.

The Z block 45 is movable in the Z direction with respect to the Y block 44. The substrate chuck part 36 is engaged with the Z block 45 in a preset arrangement state. The lower camera 46 is provided on a peripheral wall of the Y block 44 to capture an image of a lower surface of the probe card 32.

The movement part 28 moves the substrate W which is transferred by the transfer mechanism 22 of the loader 13, below the inspection unit 30. By moving the X block 42 in the X direction, the movement part 28 is movable below the inspection unit 30 of each of the inspection chambers 24 arranged in series in the X direction. The movement part 28 moves the X block 42, the Y block 44, and the Z block 45 using a movement mechanism (not illustrated), and moves the substrate chuck part 36 on which the substrate W is placed, in the X direction, the Y direction, and the Z direction. With this movement, the electrodes of each of the plurality of semiconductor devices formed on the substrate W are aligned with the plurality of probes 32a of the probe card 32, so that the electrodes and the probes 32a are brought into contact with each other. After the inspection, the movement part 28 separates the substrate W on the substrate chuck part 36 from the probe card 32 and delivers the substrate W to the transfer mechanism 22.

The measurement part ;tides measures the attractive force of the substrate chuck part 36 in the state in which the substrate W is placed on the substrate chuck part 36. A plurality of attraction holes for attracting the substrate W therethrough is formed in an attraction surface of the substrate chuck part 36, to which the substrate W is attracted. The plurality of attraction holes are connected to the vacuum line 60 connected to the substrate chuck part 36, and are evacuated through the vacuum line 60 so as to attract the substrate W. The measurement part Mes measures an internal pressure of the vacuum line 60 connected to the substrate chuck part 36. The vacuum line 60 is connected to a vacuum source such as a pump.

The controller Cnt may be a computer. The controller Cnt is provided with a main controller including a CPU, an input device (a keyboard and the like), an output device (a printer and the like), a display device (a display and the like), and a storage device. The main controller of the controller Cnt entirely controls the operation of the inspection apparatus 100 by executing various computer programs stored in the storage device.

When transferring the substrate W to the substrate chuck part 36, bringing the substrate W into contact with the probes 32a of the probe card 32, and performing an electrical inspection on the semiconductor devices formed on the substrate W, the controller Cnt performs a series of processes as follows.

First, the controller Cnt places the substrate W on the substrate chuck part 36 on the movement part 28 through the transfer mechanism 22. Subsequently, the controller Cnt performs the alignment of the substrate W with respect to the probe card 32

Subsequently, the controller Cnt controls the movement part 28 to move upwards the substrate chuck part 36 and bring the substrate W into contact with the probes 32a of the probe card 32.

Subsequently, the controller Cnt controls the movement part 28 to further move upwards the substrate chuck park 36 so as to press the substrate W against the probes 32a.

Thereafter, the controller Cnt evacuates the space surrounded by the bellows 35 in the state in which the substrate W is pressed against the probes 32a. By this evacuation, the substrate chuck part 36 is attracted to the support plate 33 and the substrate W is pressed against the probes 32a. Subsequently, the controller Cnt controls the tester 31 to perform the electrical inspection in the state in which the substrate W is pressed against the probes 32a.

Upon completing the electrical inspection on the electrical characteristics of the semiconductor devices formed on the substrate W, the controller Cnt performs a process (operation) in a reverse order of the above-mentioned process. That is, the controller Cnt moves downwards the substrate chuck part 36 and returns the substrate W on the substrate chuck part 36 to the transfer container 18 through the transfer mechanism 22.

The controller Cnt simultaneously performs in parallel the operation of transferring the substrate W from the transfer container 18 placed on the loading port 19 to the inspection unit 30 using the transfer mechanism 22, performing the electrical inspection on the substrate W, and returning the substrate W which has undergone the electrical inspection, to the transfer mechanism using the transfer mechanism 22.

Figure 5:
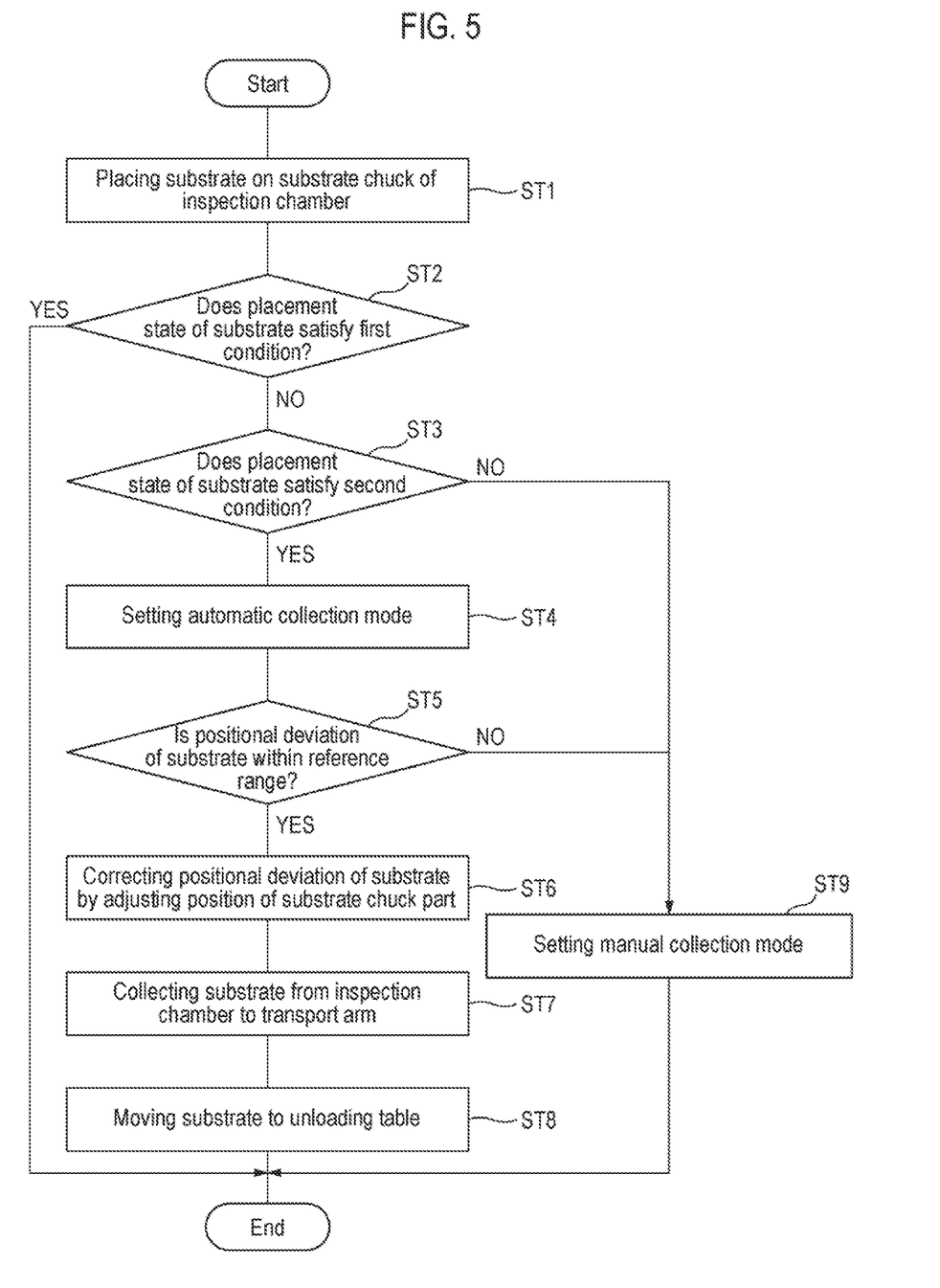
FIG. 5 is a flowchart illustrating an example of an inspection method according to an embodiment.

Specifically, the controller Cnt executes an inspection MT illustrated in the flowchart of FIG. 5. In the execution of the inspection MT, the controller Cnt performs a first determination based on a first condition and the measurement result of the measurement part Mes, and a second determination based on a second condition different from the first condition and the measurement result of the measurement part Mes.

The first condition and the second condition are conditions for determining whether or not the attractive force of the substrate chuck part 36 is good (in other words, whether or not the substrate W is satisfactorily placed on the substrate chuck part 36). As an example, the first condition and the second condition may be expressed by the internal pressure of the vacuum line 60 connected to the substrate chuck part 36. The second condition is a more alleviated condition than the first condition.

In an embodiment, the first condition may be a condition of a low pressure of negative 40 [kPa] or lower with respect to atmospheric pressure (e.g., 61.3 [kPa] or lower when atmospheric pressure is assumed to be 101.3 [kPa]). The second condition may be a condition of a low pressure of negative 5 [kPa] or lower with respect to atmospheric pressure (e.g., 96.3 [kPa] or lower when atmospheric pressure is assumed to be 101.3 [kPa]).

When the first condition is satisfied, it is determined that the attractive force of the substrate chuck part 36 is good. Thus, it is determined that the substrate W is satisfactorily attracted to the substrate chuck part 36. When it is determined that the first condition is not satisfied but the second condition is satisfied, it is determined that the attractive force of the substrate chuck part 36 is not good, the substrate W needs to be collected, and thus automatic collection by the transfer mechanism 22 is possible. When it is determined that the second condition is not satisfied, it is determined that the attractive force of the substrate chuck part 36 is poor, the substrate W needs to be collected and the automatic collection by the transfer mechanism 22 is not possible, and thus manual collection is necessary.

The controller Cnt selects one of a plurality of preset operations based on the result of the first determination and the result of the second determination. The controller Cnt executes a process according to the selected operation. Examples of the plurality of preset operations selected by the controller Cnt may include the collection of the substrate W using the transfer mechanism 22, a position correction of the substrate W before collection using the upper camera 29, a speed adjustment of the position detection operation of the wafer W using the movement part 28 and the like.

The inspection MT will be described in more detail with reference to FIG. 5. The controller Cnt places the substrate W on the substrate chuck part 36 provided on the movement part 28 of the inspection part 12 using the transfer mechanism 22 (step ST1).

In step ST2 following step ST1, the controller Cnt determines whether or not the placement state of the substrate W satisfies the first condition. When it is determined in step ST2 that the first condition is not satisfied (step ST2: NO), the controller Cnt proceeds to step ST3.

When it is determined in step ST2 that the first condition is satisfied (step ST2: YES), it is determined that the substrate W is satisfactorily attracted to the substrate chuck part 36, and the inspection MT is terminated. A series of operations for conducting the electrical inspection with respect to the substrate W is continued.

In step ST3, the controller Cnt determines whether or not the placement state of the substrate W satisfies the second condition. When it is determined in step ST3 that the second condition is satisfied (step ST3: YES), it is determined that the attractive force of the substrate chuck part 36 is not good, the substrate W needs to be collected, and an automatic collection by the transfer mechanism 22 is possible. In this case, the controller Cnt proceeds to step ST4.

When it is determined in step ST3 that the second condition is not satisfied (step ST3: NO), the controller Cnt proceeds to step ST9 where the collection of the substrate W is set to be performed in a manual collection mode, and the inspection MT is terminated. After step ST9, the substrate W is manually collected from the inspection chamber 24.

In step ST4, the controller Cnt sets the collection mode of the substrate W to the automatic collection mode and controls the transfer mechanism 22 to collect the substrate W from the inspection chamber 24. The process proceeds to step ST5. In step ST5, before the collection of the substrate W, the controller Cnt measures a positional deviation between a position of the substrate W detected by the upper camera 29 and a reference position of the substrate W (a position at which the substrate W is capable of being stably gripped by the transfer arm 51 of the transfer mechanism 22). The position detection of the substrate W by the upper camera 29 is performed by moving upwards a plurality of specific portions (e.g., end portions) of the substrate W below the upper camera 29 kept at a fixed position by the movement mechanism of the movement part 28, detecting positions of the plurality of end portions using the upper camera 29, and calculating the center position of the substrate W.

In step ST5, the controller Cnt controls the movement part 28 to suppress a movement speed of the substrate W when the position of the substrate W is detected (so that the speed becomes about 1/10 of the standard speed). In an embodiment, a speed at which the position of the substrate W is detected by the upper camera 29 may be controlled by, for example, expanding or contracting an image-capturing time interval (such as a shutter interval) of the upper camera 29.

In step ST5, the controller Cnt determines whether or t the measured positional deviation falls within a reference range less than ±8 [mm]). When it is determined in step ST5 that the positional deviation falls within the reference range (step ST5: YES), the controller Cnt proceeds to step ST6.

When it is determined in step ST5 that the positional deviation falls outside the reference range (step ST5: NO), the controller Cnt proceeds to step ST9 and the inspection MT is terminated. After step ST9, the substrate W is manually collected from the inspection chamber 24.

In step ST6, the controller Cnt adjusts the position of the substrate chuck part 36 and corrects the positional deviation of the substrate W by controlling the movement part 28 to correct the positional deviation measured in step ST5.

In step ST7 following step ST6, the controller Cnt collects the substrate W from the inspection chamber 24 using the transfer arm 51. In step ST8 following step ST7, the controller Cnt moves the substrate W collected from the inspection chamber 24 to the unloading table 20, and the inspection MT is terminated.

According to the embodiment described above, the attraction state of the substrate W is not determined only by the first determination based on the first condition, but it is determined after performing the second determination based on the second condition different from the first condition. Accordingly, the determination of the attraction state of the substrate W is performed more precisely, thus more effectively improving the attraction state of the substrate W.

In addition, when it is determined in the first determination that the first condition is not satisfied and it is determined in the second determination that the second condition is satisfied, the controller Cnt controls the loader 13 to collect the substrate W. Accordingly, it is possible to improve the collection efficiency of the substrate W.

In addition, before the substrate W is collected, the controller Cnt measures the positional deviation between the position of the substrate W detected by the upper camera 29 and the reference position of the substrate W, and when the positional deviation falls within the reference range, the controller Cnt controls the movement part 28 to adjust the position of the substrate chuck part 36 so as to correct the positional deviation. Accordingly, when the positional deviation occurs in the position of the substrate W, it is possible to suitably correct the positional deviation of the substrate W before the substrate W is collected.

In addition, the controller Cnt controls the movement speed of the movement part 28 that moves the substrate W so as to suppress the detection speed of the position of the substrate W. Accordingly, it is possible to improve the accuracy in the position detection of the substrate W.

According to the present disclosure in some embodiments, it is possible to cope with a problem that an attraction of a substrate to a substrate chuck part is poor.

Although various embodiments have been described above, the present disclosure is not limited to the above embodiment, and various omissions, substitutions, and changes may be made. Also, elements in different embodiments may be combined to form other embodiments.

From the foregoing, it should be understood that various embodiments of the present disclosure have been described herein, and that various modifications can be made out departing from the scope and spirit of the present disclosure. Accordingly, the various embodiments disclosed herein are not intended to be limiting, and the true scope and spirit of the present disclosure are indicated by the appended claims.

What is claimed is:

1. An inspection apparatus provided with a plurality of inspection chambers for inspecting an electrical characteristic of a semiconductor device formed on a substrate, the inspection apparatus comprising:
    a substrate chuck part configured to attractively hold the substrate during an inspection;
    a measurement part configured to measure an attractive force of the substrate chuck part in a state in which the substrate is placed on the substrate chuck part; and
    a controller configured to perform a first determination based on a first condition and a measurement result of the measurement part and a second determination based on a second condition different from the first condition and the measurement result of the measurement part, and configured to select one of a plurality of preset operations based on a result of the first determination and a result of the second determination and execute a process corresponding to the selected operation.

2. The inspection apparatus of claim 1, wherein the controller is further configured to control a loader to collect the substrate when it is determined that the first condition is not satisfied in the first determination and that the second condition is satisfied in the second determination, and
    wherein the loader is configured to perform placement of the substrate on the substrate chuck part and collection of the substrate from the substrate chuck part.

3. The inspection apparatus of claim 2, wherein the controller is further configured to measure a positional deviation between a position of the substrate and a reference position of the substrate before the collection of the substrate, and to adjust a position of the substrate chuck part by controlling a movement part to correct the positional deviation when the positional deviation falls within a reference range.

4. The inspection apparatus of claim 3, wherein the controller is further configured to control the movement part to suppress a movement speed of the movement part when detecting the position of the substrate.

5. A method of inspecting an electrical characteristic of a semiconductor device formed on a substrate using an inspection apparatus provided with a plurality of inspection chambers,
    wherein the inspection apparatus comprises a substrate chuck part configured to attractively hold the substrate during an inspection and a measurement part configured to measure an attractive force of the substrate chuck part in a state in which the substrate is placed on the substrate chuck part,
    the method comprising:
    performing a first determination based on a first condition and a measurement result of the measurement part and a second determination based on a second condition different from the first condition and the measurement result of the measurement part; and
    selecting one of a plurality of preset operations based on a result of the first determination and a result of the second determination, and executing a process corresponding to the selected operation.

* * * * *